US006563891B1

United States Patent
Eriksson et al.

(10) Patent No.: US 6,563,891 B1
(45) Date of Patent: May 13, 2003

(54) AUTOMATIC GAIN CONTROL FOR SLOTTED MODE OPERATION

(75) Inventors: Håkan Bengt Eriksson, Lund (SE); Kjell Berthold Gustafsson, Lund (SE); Paul Wilkinson Dent, Pittsboro, NC (US)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 09/434,444

(22) Filed: Nov. 5, 1999

Related U.S. Application Data
(60) Provisional application No. 60/109,690, filed on Nov. 24, 1998.

(51) Int. Cl.[7] .............................................. H04L 27/08
(52) U.S. Cl. ................. 375/345; 455/234.2; 455/241.1; 455/251.1
(58) Field of Search ...................... 375/345; 455/234.1, 455/234.2, 240.1, 241.1, 244.1, 245.1, 249.1, 251.1; 329/350

(56) References Cited

U.S. PATENT DOCUMENTS

| | | | |
|---|---|---|---|
| 5,048,059 A | 9/1991 | Dent ............................ | 375/94 |
| 5,267,272 A | * 11/1993 | Cai et al. ..................... | 329/350 |
| 5,524,009 A | 6/1996 | Tuutijarvi et al. ......... | 370/95.3 |
| 5,568,518 A | 10/1996 | Dent ............................ | 375/340 |
| 5,617,060 A | 4/1997 | Wilson et al. ............... | 330/129 |
| 5,732,341 A | 3/1998 | Wheatley, III | |
| 6,289,044 B1 | * 9/2001 | Velez et al. .................. | 375/222 |
| 6,324,230 B1 | * 11/2001 | Graham et al. ............. | 375/345 |

FOREIGN PATENT DOCUMENTS

| | | |
|---|---|---|
| EP | 0 411 756 A2 | 2/1991 |
| EP | 0 797 298 A2 | 9/1997 |
| GB | 2 149 245 A | 6/1985 |
| GB | 2 314 705 A | 1/1998 |
| GB | 2 315 621 A | 2/1998 |

OTHER PUBLICATIONS

Patent Abstracts of Japan; vol. 098, No. 14; Dec. 31, 1998 & JP 10 233714 A (Fujitsu General Ltd), Sep. 2, 1998 *abstract*.
Patent Abstracts of Japan; vol. 098, No. 002; Jan. 30, 1998 JP 09 284071 (Kokusai Electric Co Ltd); Oct. 31, 1997 *abstract*.

* cited by examiner

*Primary Examiner*—Amanda T. Le
(74) *Attorney, Agent, or Firm*—Burns, Doane, Swecker & Mathis, LLP

(57) ABSTRACT

A receiver having a digital automatic gain control (AGC) circuit is disclosed for use in a cellular communication system, including a Hierarchical Cellular System. The receiver includes a controller which switches between gain control values depending on system operational mode. In this way, the AGC can be optimized for different types of receive processing operations, e.g., traffic reception and measurement of other channels.

29 Claims, 9 Drawing Sheets

AUTOMATIC GAIN CONTROL FOR SLOTTED MODE OPERATION

CROSS REFERENCE TO RELATED AND PRIORITY APPLICATIONS

This application claims priority under 35 U.S.C. §§119 and/or 365 to Ser. No. 60/109,690 filed in The U.S. Patent and Trademark Office on Nov. 24. 1998; the entire content of which is hereby incorporated by reference.

The present application is related to U.S. patent application entitled "Time Pattern for Transmitted Pilot from Base Stations in CDMA Systems", Ser. No. 09/093,315, filed Jun. 9, 1998. The present application claims priority from U.S. Provisional Patent Application Ser. No. 60/109,690, entitled "AGC for Slotted Mode", filed on Nov. 24, 1998, the disclosure of which is incorporated here by reference.

BACKGROUND

The present invention relates to communication systems and more particularly, to automatic gain control circuits used in radio communications systems.

In many radio receivers, an automatic gain control (AGC) circuit is used to control the dynamic range of a received signal. A typical AGC circuit may track changes in the received signal and set the gain of the receiver accordingly. Such an AGC circuit may be incorporated into a receiver used in, for example, a mobile station such as a cellular phone or a car-mounted mobile phone in a radio communications system such as a Code Division Multiple Access (CDMA) System.

The dynamic range in different parts of a radio receiver in a mobile station such as a hand-held terminal ("cellular phone") or similar portable terminal may be of importance due to requirements related to power consumption. Portable terminals are typically battery powered and thus there is a ubiquitous concern for conserving power therein. It is well known in the art that by limiting the dynamic range of a received signal within the receiver, power conservation may be realized. For example, the dynamic range of a radio signal input to an A/D converter should be as limited as possible to enable the use of low resolution, low power A/D converters in the receiver. Furthermore, power consumption in analog amplifiers and filter sections is directly proportional to the dynamic range of the input signal. Hence, there is a universal need for efficient AGC circuits to limit the dynamic range of an input signal both in the analog and digital circuit domains.

A digital AGC circuit typically tracks changes in the received signal in order to optimize the use of available dynamic range. Signal power is generally favored as a control parameter since it most directly impacts power use within the receiver. In a typical receiver, changes in received signal power may be due to fast fading, shadowing (e.g., blocking of a signal by a building, and similar external interference anomalies), or the received signal power may change due to internal system power control events and due to the impact of internal interference sources. Moreover changes in received signal power may be due to frequency channel switching associated with various configurations of cellular topology.

Cellular radio communications systems often use hierarchical cell configurations to achieve advantages by allocating cell layout and frequency reuse based on user type. Such a Hierarchical Cell Structure is further described in U.S. Patent Application entitled "Tailored HCS", Ser. No. 08/872,065, filed Jun. 10, 1997 and incorporated herein by reference now U.S. Pat. No. 6,094,581. Since mobile users fall into different use categories such as fast moving and slow moving (e.g., automobile based mobile users and walking mobile users), different cell configurations may use different operational parameters such as frequency allocation within the different categories of cells which best accommodate slow moving and fast moving users. Generally, in a hierarchical cellular system cells for slow moving users may be a subset of larger cells designated for fast moving users and may be denoted as, for example, a "pico cell", as is further described in U.S. Patent application entitled "Self Tuning Signal Strength Threshold", Ser. No. 09/179,958, filed Oct. 28, 1998 incorporated herein by reference. However, since it is plausible that a fast moving user will become a slow moving user and vice versa, and to facilitate cell to cell handoffs during the normal course of operation, it is often necessary for mobile stations to monitor the same and/or other frequency channels in anticipation of cell changeovers or handoffs. And some systems exist in the prior art to adjust the AGC gain values when performing such monitoring in anticipation of handoff. One such system Is disclosed in U.S. Pat. No. 5,524,009 to Tuutijarvi et al. on Jun. 4, 1996. Tuutijarvi et al. disclose fast AGC setting using a received signal strength (RSS) measurement procedure. In Tuutijarvi et al. when a handoff command is sent by a base station to a mobile station, "free" slots are used to measure signal strength to set an AGC in advance of switching channels in the mobile station. While such a system may improve handoff time, it does not actually change the time constant for the AGC circuit and may become overloaded in a receiver which is constantly monitoring other radio channels.

In a CDMA system, a received signal may consist of a desired signal and interference. Typically, interference dominates in a received signal, particularly when considering the use of wide spreading methods. Thus, an AGC circuit will track not only signal power but the power of the interference as well. In a CDMA system, a mobile station may be expected to perform measurements on multiple frequency channels in order to prepare for inter-frequency hand-over. At different frequency channels, received signal power may differ significantly due to different interference levels, different load, and possibly, different radio network topologies. A mobile station may further be expected to perform measurements on frequency channels associated with other radio communication systems in order to perform inter-system hand-overs. Regardless of the motivation for measurements, they should be performed as fast as possible so as, for example, not to disturb voice quality associated with an ongoing call, or not to risk losing the call connection entirely.

Situations may further arise in which a CDMA system deliberately changes the interference level and/or the desired signal level. For example, in some radio communication systems, a mobile station may switch to receive other signals for positioning purposes. Positioning may be accomplished in a mobile station by measuring signals at different frequencies from multiple base stations at a receiver within the mobile station. The measured signals together with known positions associated with the base stations from which the signals were received, are used to calculate the position of the receiver using known methods such as triangulation. During such measurements, it may be advantageous to reduce the power of interfering signals originating from the same base station as the desired signal or from adjacent base stations. Measurements may be performed repetitively and the mobile station may require several measurements to calculate and/or update its position, particularly when moving, thus leading to rapid switching between normal reception and position oriented measurement modes, hand-off modes, and the like. Identifying unsynchronized sources may further require a receiver to switch between different received signals as further described in related U.S. application Ser. No. 09/093,315, supra, incorporated herein by reference.

Problems arise however in a receiver when starting up an AGC circuit on a new frequency particularly when changing frequency channels abruptly. Because a typical AGC circuit contains a control loop and relies on filtering successive signal samples, it may takes a certain time period for the AGC circuit to settle. This may be referred to as the AGC "settling time". It is desirable to minimize the AGC settling time so as to minimize the time during which the AGC-controlled signal level is not in the target range. If multiple changeovers, or frequency switches are occurring often or continuously, the AGC settling time may occupy a large percentage of the total switching time and become a significant impediment to maintaining signal quality and conserving power.

Therefore, it would be appreciated in the art to have an AGC circuit which measured and adjusted receiver gain as quickly as possible with minimum settling time. Such a circuit would allow power to be reduced while improving quality measures on an active call connection.

SUMMARY

It is therefore an object of the present invention to provide a receiver having an improved digital AGC circuit which minimizes the time during which an AGC-controlled signal level is out of the target range.

It is a further object of the present invention to provide reduced settling time for a digital AGC circuit when switching between multiple received signals such that the dynamic range of received signals is limited by the digital AGC circuit as quickly as possible to achieve power savings.

Therefore, in accordance with one aspect of the present invention, the foregoing and other objects are achieved in a receiver having a digital AGC circuit for use in a cellular communication system in which the digital AGC circuit switches between multiple received signals. The receiver may include a frequency synthesizer for changing frequency coupled to a control processor. The control processor is coupled to a memory for storing AGC parameters. The signal input may receive multiple received signals on different frequency channels. For example, in a Hierarchical Cellular System, the multiple received signals can represent signals from various cells which are monitored, for example, for handover purposes. A controller coupled to the frequency synthesizer, memory and digital AGC circuit may effect switching from reception of a first one of the multiple received signals to a second of the multiple received signals. The controller may also effect switching between a first set of memorized AGC parameters and a second set of memorized AGC parameters, and between a first system state and a second system state. The controller may further apply a gain control parameter associated with the second system state to the digital AGC circuit which gain control parameter has been previously stored, for example, when the receiver was last switched to the second system state.

The digital AGC circuit, in accordance with an embodiment of the present invention may further include a digital filter characterized by a set of coefficients and internal states and the stored AGC parameters can include the set of coefficients and last known values of the internal states of the digital filter for each of a number of frequency channels and/or system states. A first set of parameters including filter coefficients may further be associated with a first system state and a gain value associated with a first one of the multiple received signals. A second set of parameters including a second set of filter coefficients may be associated with a second system state and a second gain value associated with a second one of the multiple received signals. The first gain value may be adjusted during reception of the first signal and the second gain value may be adjusted during reception of the second signal.

In an embodiment of the present invention, the controller may switch the receiver from receiving the second signal associated with the second system state, for example, back to receiving the first of the multiple received signals associated with the first system state, retrieve the previously memorized gain value associated with the first system state from the memory and apply the retrieved first gain value associated with the first system state to the digital AGC circuit, and may update and then memorize the second gain value associated with the second system state and the second received signal.

In an alternative embodiment of the present invention, the controller may further employ a linear predictor and the memory may be used to store one or more previous AGC parameters associated with each system state for use in linear prediction. Upon switching back to the first received signal associated with the first system state, the controller may provide the stored previous values associated with the first system state to the linear predictor to produce a present value for the first gain value which may then be applied to the digital AGC circuit such that the settling time for the digital AGC circuit is reduced with regard to the first one of the multiple received signals. The first system state may further include a timer value which allows the controller to determine. a length of time that the first AGC parameters have been stored in memory, retrieve the first gain value from the memory and apply the first gain value to the digital AGC circuit only if the length of time is below a predetermined threshold. Accordingly state values which have aged beyond their usefulness may not be applied. However, a default gain value may be applied to the digital AGC circuit if the length of time the gain value has been stored is above a predetermined threshold.

In yet another embodiment of the present invention, a controller may be configured to adapt the digital AGC circuit to a first received signal during a first measurement interval. After adapting to the first received signal, the digital AGC circuit may save a first set of parameters associated with the digital AGC circuit, the first input signal and the first measurement interval in a memory. The first set or parameters may include a system state as may be defined, for example, by reference or association, particulary in the memory with the first received signal, including for example a signal frequency or channel number, the first measurement interval including, for example, a timer value, and associating the system state with a state associated with the digital AGC circuit, including, for example, coefficients and parameters associated therewith. The controller, during the course of operation in accordance with the present invention, may be further configured to switch from a second input signal back to the first input signal at which time the controller may set the digital AGC circuit to a state derived from the first saved state. It will be appreciated that setting the digital AGC circuit with a state derived from the first saved state will have a beneficial impact on the settling time of the digital AGC circuit particularly when the characteristics of the first input signal have not changed significantly. The controller may further be configured to adapt the digital AGC circuit to the first input signal during a second measurement interval. It may be further appreciated that, for example, after adapting during a second and subsequent measurement intervals, the states associated with the digital AGC circuit, the first signal, and the second and subsequent measurement intervals may also be stored in a manner similar to that described above with reference to the first measurement interval.

BRIEF DESCRIPTION OF THE DRAWINGS

The objects and advantages of the invention will be understood by reading the following detailed description in conjunction with the drawings, in which.

DETAILED DESCRIPTION

In the following description, for purposes of explanation and not limitation, specific details are set forth, such as particular circuits, circuit components, techniques, etc. In order to provide a thorough understanding of the present invention. However, it will be apparent to those skilled in the art that the present invention may be practiced in other embodiments that depart from these specific details. In other instances, detailed descriptions of well-known methods, devices and circuits are omitted so as not to obscure the description of the present invention.

Figure 1:
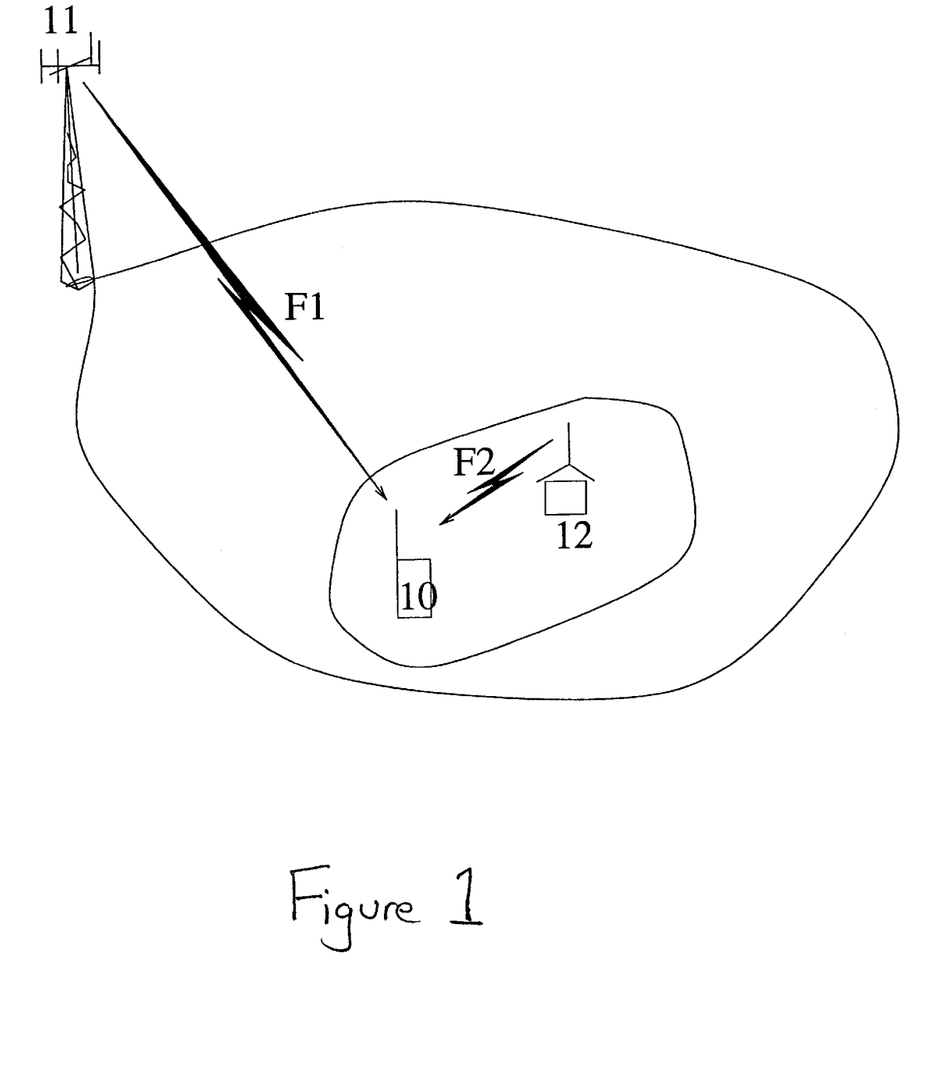
FIG. 1 depicts a mobile terminal in a macrocell/microcell hierarchical arrangement.

FIG. 1 shows a mobile phone 10 within a mobile network hierarchy including a base station 11 belonging to a macrocell, or long-range hierarchy, and a base station 12 belonging to a microcell, or short-range, hierarchy. Macrocells typically provide communications service at ranges out to 10–30 kM while a microcell is typically used to provide indoor coverage, for example in shopping malls. The microcell is often contained within a macrocell, so that to avoid interference between the two hierarchies, different frequency channels are used, for example frequency channel F1 for the macrocell and frequency channel F2 for the microcell. The mobile phone 10 should automatically detect when it is within range of microcell 12 and switch from receiving service via the macrocell to receiving service via the microcell. This optimizes the overall system capacity, as if the mobile phone 10 continued to receive service from the macrocell, that would deny the use of frequency channel F1 to another mobile phone over the extended region of coverage of the macrocell, whereas switching to receiving service from the microcell denies another mobile phone's use of frequency F2 only over the limited coverage region of the microcell.

The usual convention for handing over service from one cell to another cell, called "handoff", is that the mobile phone shall measure signal strengths of different transmissions, for example the received signal strengths on frequencies F1 and F2, and report the measured strengths to its currently serving base station or cell. The network then takes the decision to effect handoff or not, having regard to available capacity on each frequency and in each cell and issues the appropriate command to the mobile phone.

Handoff procedures apply when the mobile phone is already engaged in a call. When already passing for example voice traffic, it is desirable to avoid too much interruption to voice traffic caused by the need to make measurements on other frequency channels. It is also desirable to avoid the complexity of having a separate traffic receiver and measuring receiver in a small, low-cost and battery-operated mobile phone. Consequently measurements are performed by temporarily retuning the receiver from F1 to F2 and back again. There can also be several frequency channels on which measurements should be made, i.e., more than two, and the list of frequency channels on which measurements should be made is transmitted from the serving base station to the mobile phone, and may include frequencies associated with neighboring macrocells, microcells, private picocell, home or office systems or communications satellites.

When the mobile phone is idle, i.e. not currently engaged in conversation, it intermittently monitors the signal from a currently chosen base station transmitter with a pre-agreed duty factor, chosen to save the maximum amount of battery power. The base station may call a particular mobile phone only during the periods it is known to be listening, called its "sleep-mode slot". Different mobile phones are allocated to different sleep-mode slots so as to even out the time variation of the calling load. Between its sleep-mode slots, the mobile phone has plenty of spare time in which to make signal measurements on other frequency channels, however it is desirable to be able to accomplish these as fast as possible so as to minimize the time for which the receiver is powered on and taking current from the battery.

Accordingly, an object of the present invention is to reduce the amount of receiver on-time associated with making measurements on other base station frequencies.

From FIG. 1 it may be appreciated that the ratio between the distances from a mobile phone to a macrocell base station and a microcell base station respectively may be very large, for example 10 kM: 100 m. The signal strength is know to vary according to an approximately fourth power of distance. A microcell may also use different antenna gains and heights and different transmit power levels compared to a macrocell, and thus this combination of differences together with the uncertainty of position of the mobile phone can lead to the mobile phone having to cope with large variations in signal level. The amount of variation in signal level a receiver can cope with is normally referred to as its "dynamic range". Usually, some form of automatic gain control (AGC) is needed to obtain a large dynamic range, in which an AGC circuit compares the amplified receiver output signal with a desired threshold value and automatically increases or decreases the amplification to maintain the output signal within a desired range. An alternative approach entitled "Logpolar Signal Processing" is described in U.S.

Pat. No. 5,048,059 to Dent, which is hereby incorporated by reference herein. The logpolar technique is more readily used in narrowband receivers such as FDMA or TDMA receivers and is not necessarily well suited for wideband receivers such as CDMA receivers.

Another important characteristic of receivers may be called "instantaneous dynamic range". When a receiver receives an amplitude-modulated (AM) signal, or non-constant amplitude signal, the amplitude variations contain important information and, therefore, should not be distorted. Accordingly, an AGC system operating on AM signals controls only the relatively long term mean value of the amplified receiver output signal, so as not to distort the more rapid, information-bearing amplitude changes. An AGC system therefore normally comprises a low-pass filter to separate out the more slowly varying amplitude changes due to fading for example, from the more rapidly varying amplitude changes due to information modulation. In a CDMA system employing linear modulation of a radio frequency carrier with chip rates in the region of 4 Megahertz, there is in principle no difficulty in separating these high modulation components from fading components that lie below 1 KHz. When the mean signal level is controlled to some value, e.g., one volt, or one unit, and the signal is a noise-like signal, such as a sum of many CDMA signals, its instantaneous amplitude may easily reach three times the mean value or more. Indeed, the peaks of a truly Gaussian noise-like signal are unlimited. Practical receiver amplifiers however will limit these signals at some level thereby causing distortion, and the purpose of the AGC is then to control the mean or root-mean-square (rms) level of the signal to a value such that peaks of, e.g., three times the rms level, will not be clipped. The ratio between the mean controlled signal level and the clipping level of the receiver is the instantaneous dynamic range.

Modern cellular phone systems use digital transmission methods such as TDMA or CDMA to obtain higher transmission capacity and quality. Processing these signals in a receiver involves amplifying, filtering and downconverting the signal to a suitable low intermediate frequency, even to baseband I and Q signals centered around DC, called the complex baseband, and then digitizing the signal using AtoD convertors that preserve a complex-vector representation of the radio signal's phase and amplitude variations. High speed AtoD convertors required for digitizing wideband CDMA signals are power consuming, and it is desirable to limit the resolution, in bits, of such devices in order to save power. Because CDMA signals are decodable at signal-to-noise-plus-interference ratios of much less than unity, the AtoD convertor wordlength required from the standpoint of quantizing noise is not very great, for example two bits plus sign, for each of I and Q bit streams. However, if the rms value of the signal is a factor of three below the peak value that shall be represented without distortion, a further factor of 3 or 1.5 bits of headroom is required, giving a 34 bit plus sign representation. This assumes that an AGC system has been used successfully to control the rms level of the signal presented to the AtoD convertor to lie in precisely the correct range. If the AGC system was only able to control the signal level to within +/−3 dB, a further bit of resolution would be required in the AtoD convertors. Without AGC, the variations in signal level in the situation of FIG. 1 would, of course, be very much greater than +/−3 dB. Thus a wideband CDMA receiver may have a very limited instantaneous dynamic range in relation to the total dynamic range of possible signal levels with which it must cope.

Figure 2:
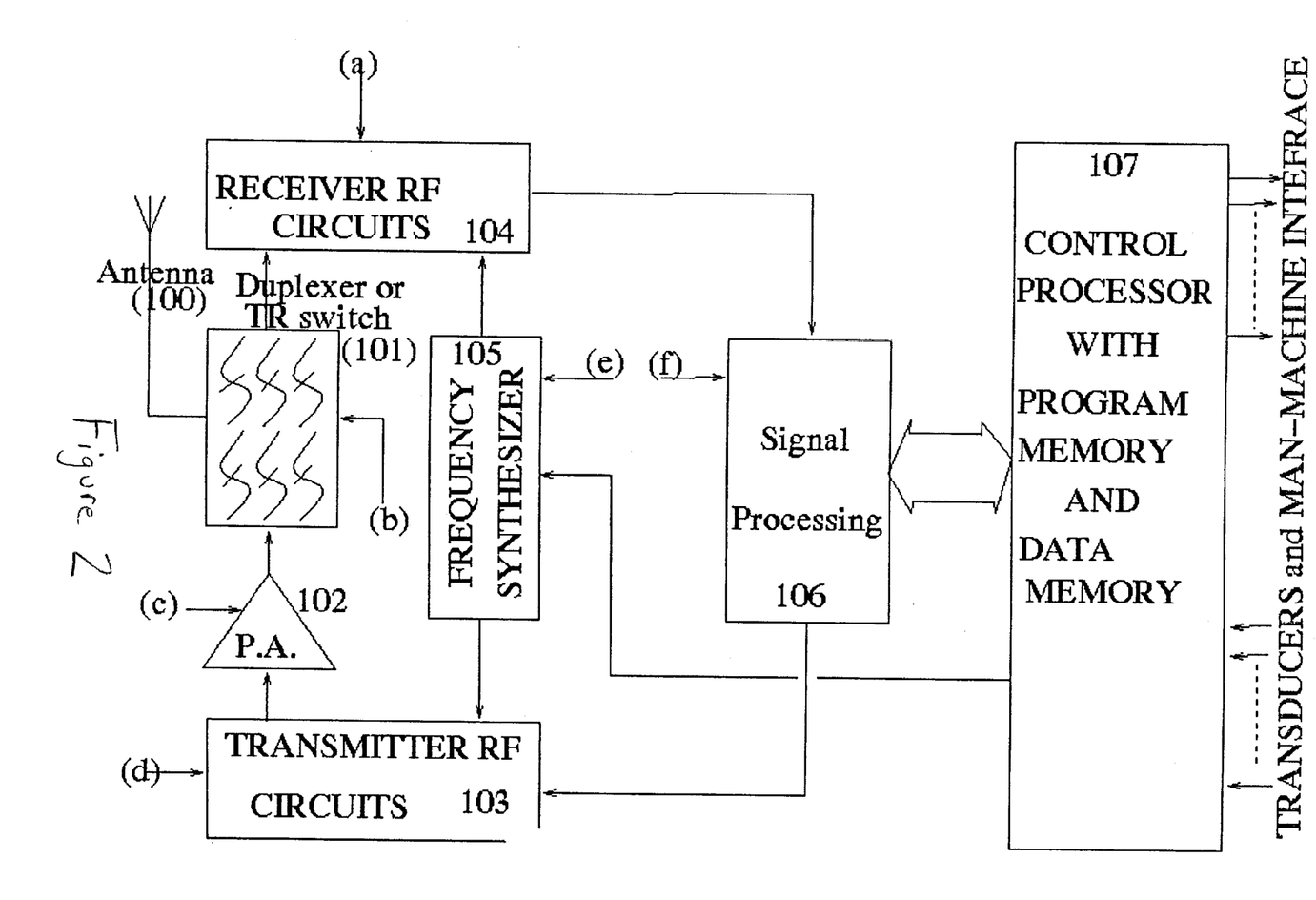
FIG. 2 is a block diagram of a wireless terminal.

A typical wireless telephone block diagram in which the inventive AGC system and method according to the present invention may be implemented is shown in FIG. 2. Signals are received at various frequencies in the cellular frequency band by mobile phone antenna 100, and passed via duplexer 101 to the receiver RF circuits 104 which can include fixed and variable gain amplifiers, filtering, heterodyne downconversion and AtoD conversion to produce complex numerical samples for signal processing 106. Frequency synthesizer 105 is controlled by control processor 107 to produce various local oscillator frequencies for the heterodyne downconversion, otherwise known as mixing, thereby controlling the frequency of the received signal which is selected to be converted for signal processing. The control processor 107 at various different instants may thus control the receiver to receive and process traffic signals including coded voice signals on a first frequency channel, and alternatively to make signal strength measurements on a second frequency channel.

When the receiver of FIG. 2 is suddenly switched to receive and process signals on a second frequency which are much stronger than the signals it was processing immediately previously on a first frequency, the receiver's instantaneous dynamic range may momentarily be exceeded, resulting in the AtoD convertor being driven to full scale and thus clipping. How much stronger the signal really is than the clipping level is then not visible to the signal processing. Conversely, if the receiver is suddenly switched from a first frequency to a second frequency on which the signal strength is much weaker, the reduced signal level at the input of the AtoD convertor may not reach one least significant bit in amplitude so that the AtoD convertor outputs a string of zero values. How much weaker the second signal is than the first signal is then also invisible to the signal processing.

Assuming AGC is in use, the AGC detector will eventually detect either of the above conditions and reduce or increase the gain accordingly until the signal input level to the AtoD convertor is once more in the middle of its optimum range. However, due to the need for a low-pass filter to separate wanted amplitude modulation components from slower fading components, conventional AGC systems cannot adapt instantaneously to the change in signal level.

One method to partly overcome the above problem is to speed-up the AGC system during measurement of other signals, as opposed to processing traffic signals, by altering the bandwidth of the AGC. The AGC does not need to avoid distorting high-frequency, information-bearing, amplitude modulation components when it is only required to measure signal level and is not required to decode the information. However, the bandwidth of the AGC is determined by a component with a memory, such as a capacitor. If a variable AGC is required, digital memory elements are more appropriate than analog components such as capacitors. Moreover, the values memorized in the memory elements of the low-pass filter used during traffic mode should be preserved during measurement mode and recalled in order to resume traffic mode.

Thus, according to the present invention there is provided a digital AGC system comprising memory elements for storing memorized AGC values associated with a first mode of operation, such as decoding traffic signals received on a first frequency, and memory elements for storing memorized AGC values associated with a second mode of operation, such as making signal strength measurements on a second frequency. In general, there is a memory for storing a list of possible system states, where a system state can comprise a number of values indicative of the mode of operation (traffic mode, measurement mode etc); the frequency channel associated with the state; the AGC filter coefficients associated with the state, and the last known AGC filter memory element values, e.g. gain values, associated with the state. The present invention also includes signal processing, such as a software program in signal processor 106 or control processor 107 for retrieving a previous state from memory and loading the retrieved values into the operative registers of the AGC system, frequency synthesizer and digitally-controlled gain amplifier stages. The signal processing also processes received signal samples using the retrieved filter coefficients to update values of the retrieved state, for example a gain value or other filter memory element value, prior to saving the updated value upon exiting the state and retrieving a different memorized state. Optionally, the signal processing can comprise linear prediction which predicts the gain that will be optimum for receiving a signal on a given frequency channel currently based on the gain that was determined to be optimum on previous occasions. The linear prediction may also optionally employ a timer value indicative of the elapsed time since a previous gain value was determined to be optimum. The current timer value may also be stored in the state memory along with the updated gain value for use in future linear prediction. The invention may also include not using a predicted or retrieved gain value when the associated stored timer value is indicative of an elapsed time greater than a threshold value, and in such circumstances a default gain value is used or a default calculation of a gain value to be used is performed.

Figure 3:
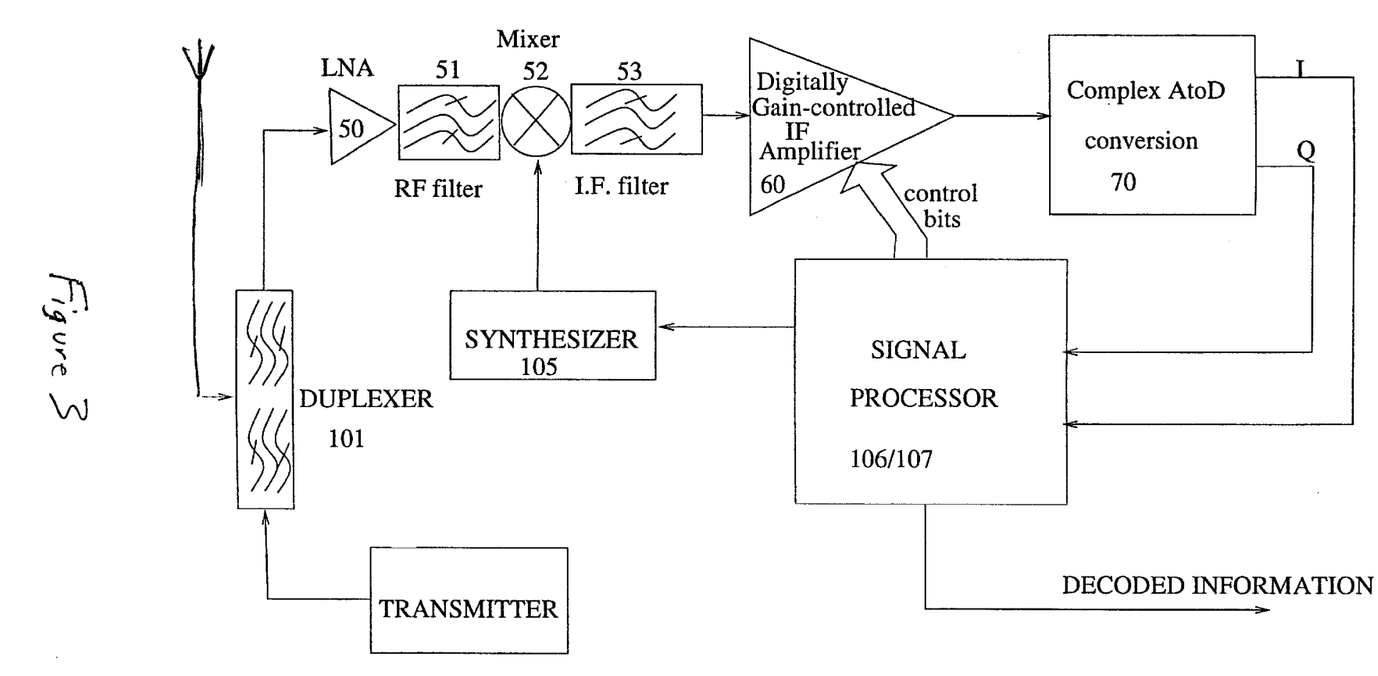
FIG. 3 depicts a digitally gained controlled receiver according to an exemplary embodiment of the present invention.

FIG. 3 shows a block diagram of a digitally gain-controlled receiver for implementing an exemplary embodiment of the present invention. Received signals from the antenna pass through the transmit/receive duplexer to the Low Noise Amplifier (LNA 50) After further filtering in RF filter 51, received signals are converted to an intermediate frequency by heterodyne mixing in mixer 52 with a local oscillator signal from a programmable frequency synthesizer. The intermediate (IF) frequency signal is then-bandpass-filtered in IF filter 53 to restrict the signal bandwidth to substantially one radio channel.

The IF signal is further amplified by a variable amount using digitally gain-controlled IF amplifier 60. The IF signal may be further processed for AtoD conversion in block 70, resulting in a stream of complex numbers denoted according to convention by (I,Q) if in Cartesian representation.

Polar or Logpolar representation could alternatively be used. Signal processor 106/107 processes the stream of complex numbers to decode received information and produces digital control bits to digitally gain-controlled amplifier 60 to maintain the level of the signal presented to the AtoD convertor in an optimum range.

Figure 4A:
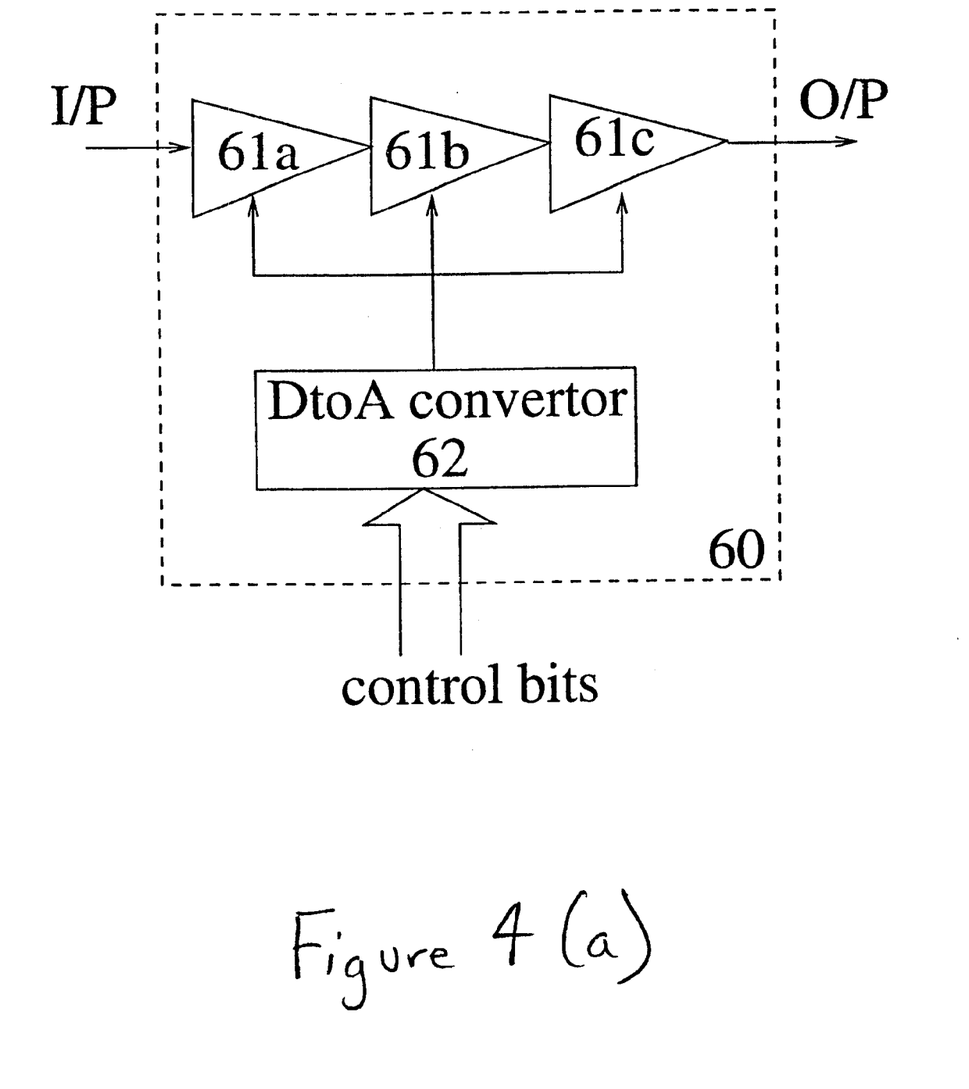
FIG. 4A depicts one example of a digitally gained controlled amplifier according to the present invention.
Figure 4B:
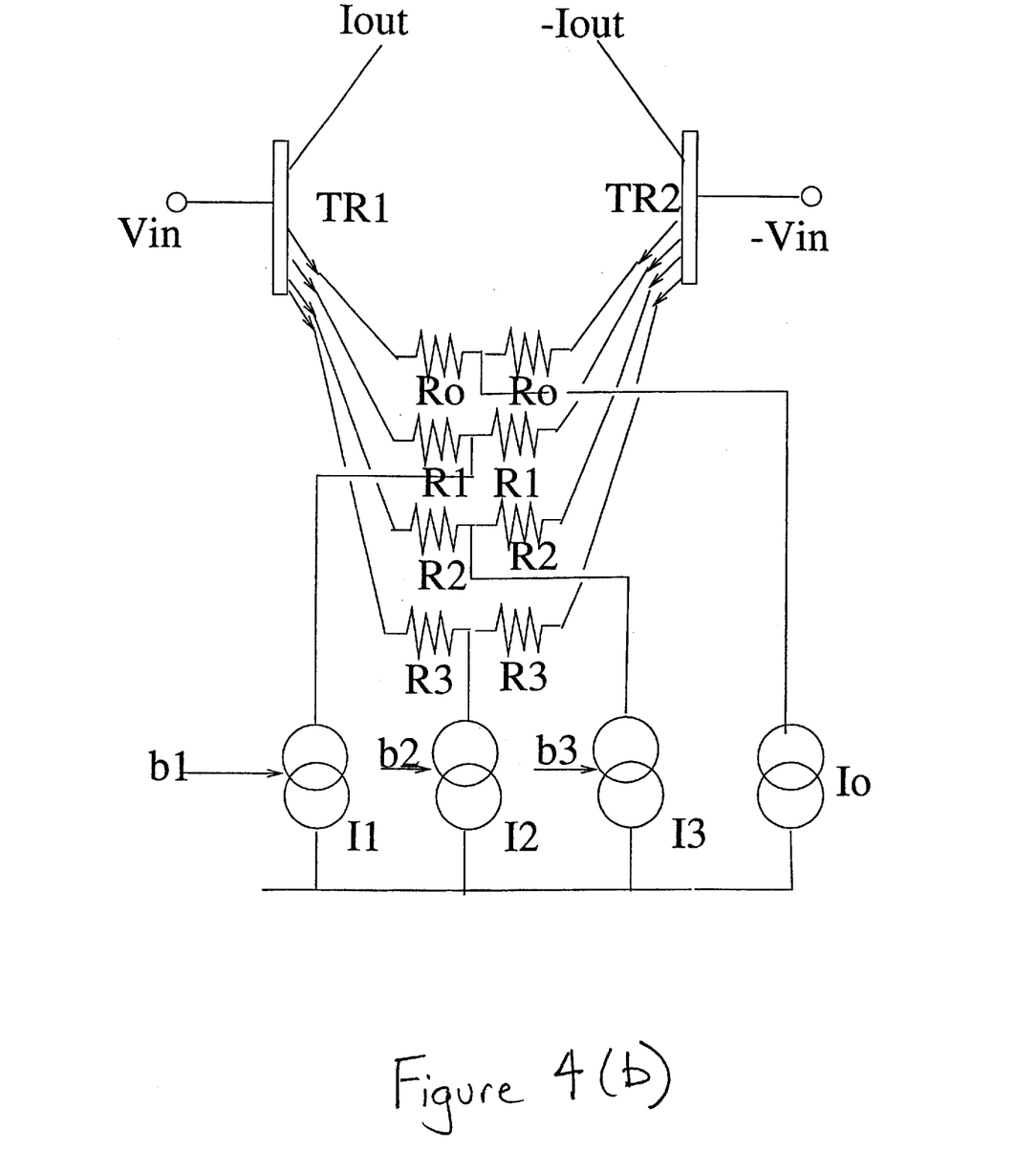
FIG. 4B describes another example of a digitally gained controlled amplifier according to the present invention.

FIGS. 4a and 4b show two possible arrangements for the digitally gain-controlled amplifier 60 according to exemplary embodiments of the present invention. In FIG. 4a, a voltage or current controlled IF AGC amplifier chain 61a, 61b, 61c amplifies the input signal to produce the amplified output signal by an amount depending on an analog control signal (voltage or current) supplied by DtoA convertor 62 to the amplifier stages. In multi-stage AGC amplifiers, an increasing AGC control signal can be provided that progressively reduces the overall gain, starting by first reducing the gain of the final stage, then reducing the gain of the penultimate stage for further gain reduction, and finally reducing the gain of the first stage only when a large gain reduction is demanded. This so-called "delayed AGC " system avoids degrading the noise figure of the amplifier too much while the signal is still at weak to medium signal levels. The characteristic control curve of gain versus control bits can be arranged to be anything desired by storing a look-up table in the signal processor 106, the look-up table being precalibrated to map a desired gain reduction factor to the correct control bits. For example, the look-up table could arrange to map gain reduction factors expressed in decibels in 0.5 dB steps to control bit patterns to be applied to DtoA convertor 62, giving then a linear control characteristic in decibels.

FIG. 4b shows an amplifier that can be directly gain-controlled by a number of control bits b1, b2, b3. Bipolar transistors TR1,TR2 are multiple-emitter transistors having (in this example) four emitters, a base and a collector each. Such a transistor can be made by paralleling the base and collector terminals of four bipolar transistors while leaving the emitters separate. The two transistors form a differential amplifier between balanced input base terminals supplied with a balanced input signal (Vin, −Vin) and an amplified output signal current (Iout,−Iout) appears at balanced collector output terminals. The amplification from input voltage +/−Vin to output current +/−Iout is given by:

$$Iout=Vin/R,$$

where R is the total equivalent resistance between the emitter terminals. R can be varied by controlling the current sources I1, I2, I3 respectively with control bits b1, b2, b3 to be either ON or OFF. For example, if b1 is asserted to turn on I1, then the total emitter resistance R is equal to Ro (which is always present because Io is always ON) in parallel with R1, that is:

$$R=RoR1/(Ro+R1)$$

Alternatively, bit b2 or b3 could be asserted, or bit b1 and bit b2, bit b1 and bit b3 etc or even all three bits giving eight possible values of R that may be selected. The values of R1, R2, R3 and Ro can be chosen to give a linear progression of conductance when the control bits are incremented through their eight possible values. Alternatively an approximation to eight, 0.5 dB steps can be made.

The amplifier of FIG. 4b may be one amplifier in a chain of similar amplifiers. In that case, for example, another amplifier in the chain can provide approximately 4 dB steps if the first amplifier included in the chain provides eight 0.5 dB steps, and a third amplifier providing approximately 32 dB steps if the second amplifier provides eight 4 dB steps, and so on. Thus an approximately linear control characteristic in decibels versus control bit-code can be provided by cascading suitably designed amplifiers of the type shown in FIG. 4b. In both cases, i.e., FIGS. 4a and 4b, capacitors may be used to smooth the step-transitions between discrete gain values. Typically, it is desirable to maintain nearly constant gain over one CDMA symbol period comprising many chip periods, therefore a suitable step transition duration would be, for example, a 64-chip symbol period, or 16 uS at a chip-rate of 4 Megahertz. This can be provided by slugging the turn-on and turn-off rates of current sources I1, I2 and I3, or by a capacitor on the output voltage line of DtoA convertor 62.

Figure 5:
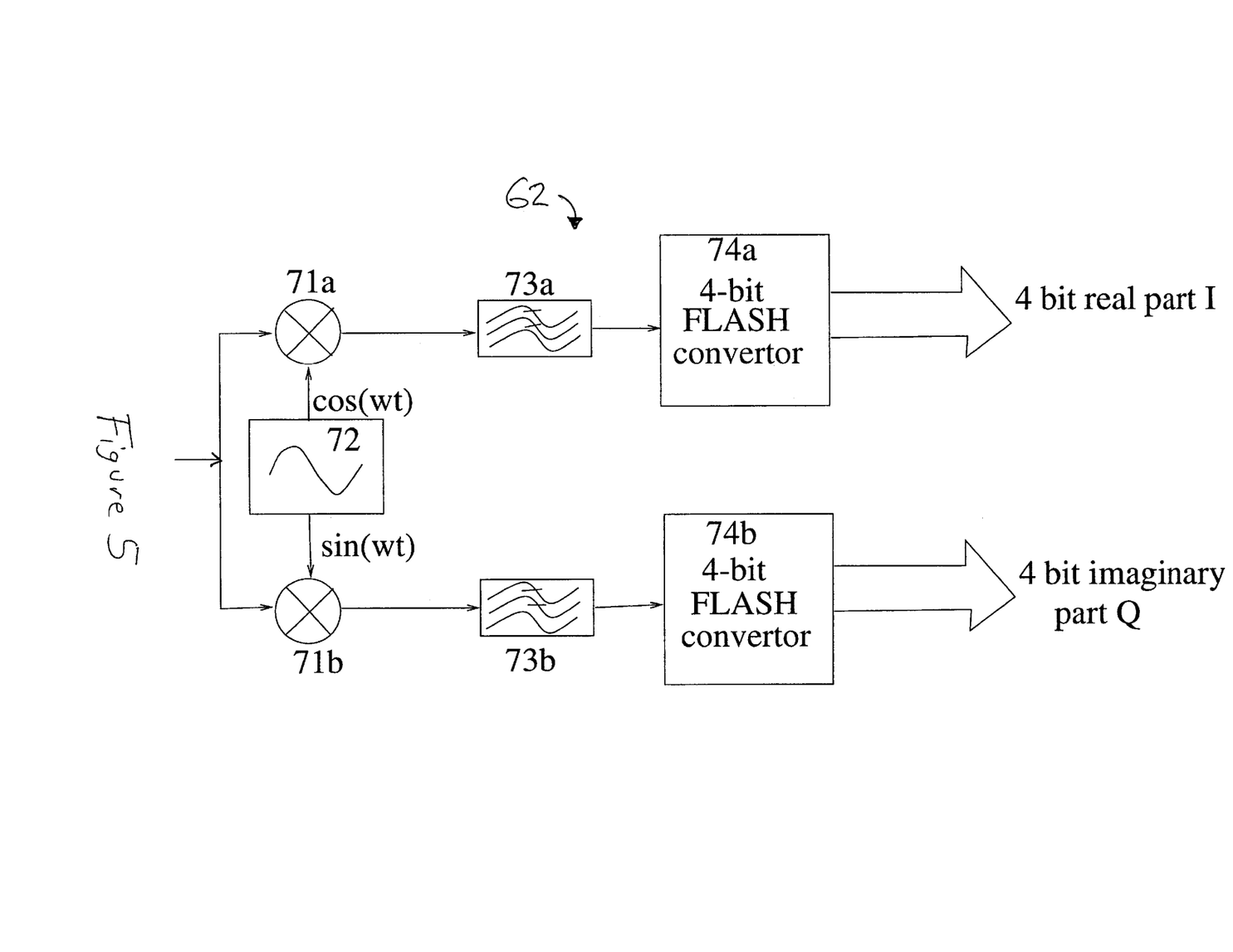
FIG. 5 illustrates a complex A-D converter which can be used in conjunction with the present invention.

FIG. 5 shows a complex AtoD convertor 62 which can be used in accordance with the present invention. The amplified IF signal from AGC-controlled amplifier 60 is applied to the inputs of a quadrature downconvertor composed of in-phase mixer 71a, which multiplies the input signal by a cosine wave at the IF center frequency generated by local generator 72, and to the input of quadrature mixer 71b where it is multiplied by a sine wave from generator 72. The mixer outputs are low-pass filtered in filters 73a, 73b to remove double-IF components and to supplement the channel filtering already partly performed by IF filter 53. The outputs from filters 73a,73b are then fed to FLASH convertors 74a,74b where the signals are quantized to four bit values, i.e., to the nearest of 16 possible levels distributed between a greatest possible positive level and a greatest possible negative level. Various ways of making FLASH convertors can be contemplated, such as using 16 comparators to compare the input signal against each of the 16 levels, alternatively one comparator to compare the signal with zero to determine the signal sign, and then eight comparators to quantify the magnitude to 3 bits, giving a sign-magnitude representation. Quantizing levels may be non-uniformly spaced, the four bit outputs then being converted to the actual levels they represent using a look-up table which specifies the levels to a greater number of bits than four. For uniformly spaced quantizing spaced levels, the levels can represent signals of +/−1 unit, +/−3 units, +/−5 units, +/−7 units, +/−11 units, +/−13 units or +/−15 units. One objective of the inventive AGC system is to ensure that the signal is maintained at a level somewhere in the middle of the 16 possible levels of the FLASH convertor on average, e.g., swinging between level +5 and level −5, while not often exceeding the maximum positive level of +15 or the maximum negative level of −15. The signal processor 106/107 thus determines the average (e.g., rms or mean-square) signal level, and if it is too high the gain of amplifier 60 will be reduced by changing the control bits, alternatively the gain will be increased if the average signal level is too low.

Other methods of digitizing a radio signal may be employed, such as the logpolar method of above-incorporated U.S. Pat. No. 5,048,059, or alternatively the quadrature sampling method of U.S. Pat. No. 4,888,557 to Puckette et al, which is hereby incorporated by reference herein.

Figure 6:
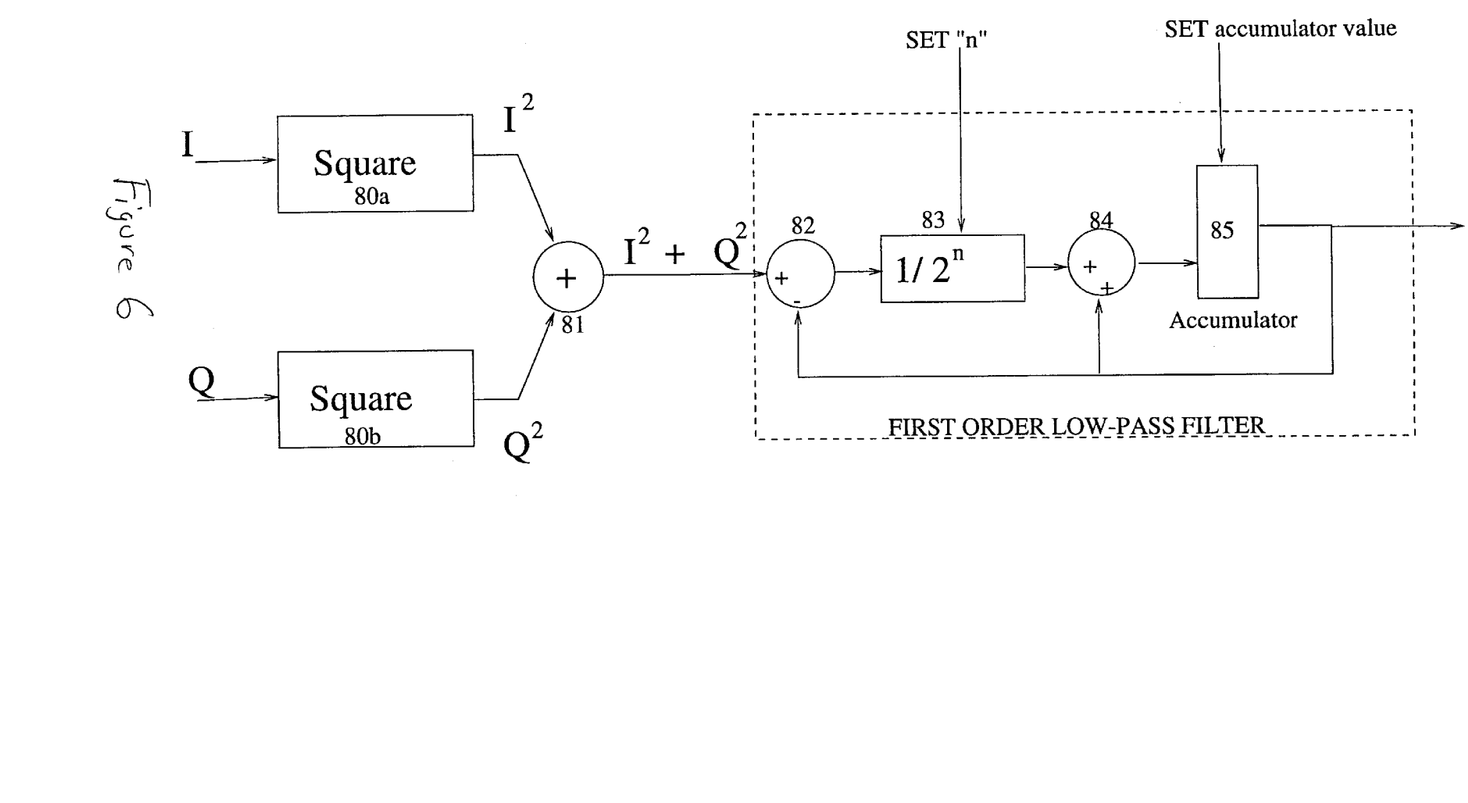
FIG. 6 is a mean signal level detector according to an exemplary embodiment of the present invention.

FIG. 6 shows one type of average signal level detector that can be used by signal processor 106/107 to perform the afore-described function. Therein, the 4-bit I signal is applied to squaring logic 80a and the Q signal is likewise squared in 80b. Four-bit quantities may be squared by applying them to a 16-value look-up table giving the square. In sign-magnitude representation, only the 3-bit magnitude need be applied to an 8-element look-up table to get the square. The squares are added in adder 81. It will be appreciated that I squared plus Q squared is a measure of the square of the instantaneous amplitude of the complex vector radio signal, which would be constant for a purely phase-modulated signal. The result will however fluctuate at high frequencies due to non-constant amplitude modulation, and the high frequency fluctuations should be removed to yield a smoothed value for the mean square signal level. A first-order (single pole) low-pass filter is shown in FIG. 6, which implements the algorithm:

Next mean value=last mean value+(input value−last mean value)/$2^n$

The divisor $2^n$ is chosen so that it may be implemented by a simple n-place right shift, and determines how rapidly the low pass filter can follow changes in the input. In anticipation that different filter speeds will be needed in different receiver modes, provision is made to vary "n" by setting it from the processor 106/107. Likewise, in anticipation that a receive mode change may require the current accumulator value to be saved and replaced by retrieving a previous value from memory, provision is made to SET the accumulator to a value from the processor 106/107. The low-pass filter may of course be entirely constructed as a suitable software program within a programmable digital signal processor.

If desired, the accumulator output value, which is representative of the mean square signal amplitude, may be subjected to a square-root operation if root-mean-square values are required, or subjected to a logarithmic function if the mean signal level is to be expressed in decibels. It is also possible to measure mean signal level in other ways, for example, in sign-magnitude representation, the sum of the I and Q magnitude could be used and low-pass filtered; alternatively, the number of times I or Q exceeded the maximum positive or negative levels could be observed and used as the control parameter. It is largely immaterial which of the above methods is used, an objective of the AGC system is to control the parameter, however expressed, to be equal in the mean to a target value, expressed in the same manner.

Figure 7:
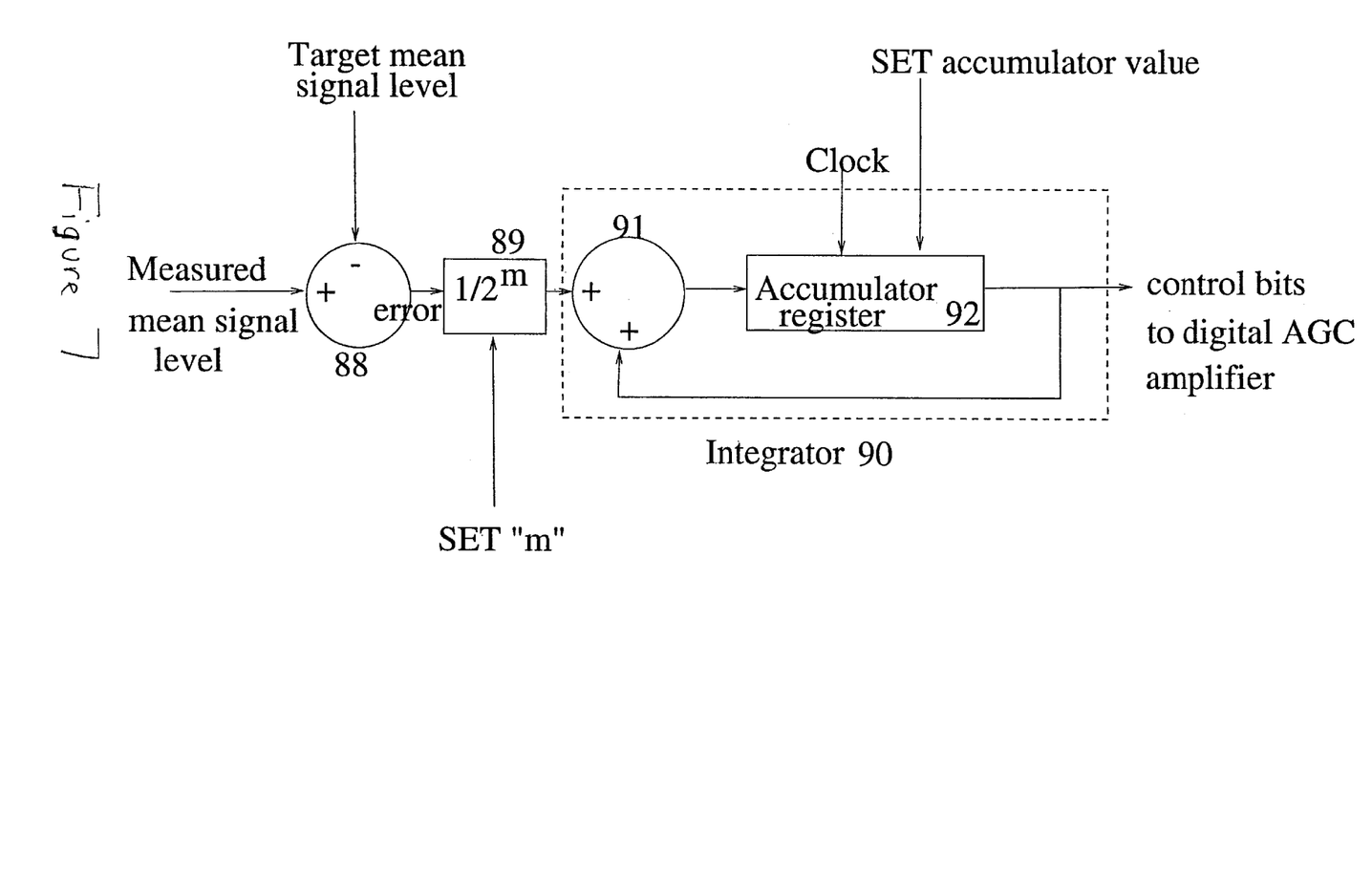
FIG. 7 is a first order AGC control loop according to an exemplary embodiment of the present invention.

FIG. 7 shows a first-order control loop for controlling the signal level to approach a target mean value. The measured signal level, howsoever defined and measured, is compared by subtraction in comparator 88 with a target signal level, defined in the same way. The difference is the discrepancy or error from the desired target value. The error is scaled by division by $2^m$ in scaler 89 and then integrated in integrator 90 by accumulation of the scaled value in adder 91 with the previous cumulative value from accumulator 92, at every tick of a suitable clock or timebase. Having regard to previous comments regarding the desirability of maintaining constant gain over a CDMA symbol interval, the clock period may suitably be one CDMA symbol period such as 16 uS.

If the accumulated value is positive, indicating a tendency for the signal to persist at a level greater than the target level, the control bits extracted from the accumulator 92 control the AGC amplifier 60 to effect a gain reduction. Conversely, if the accumulated error value is negative, indicating a tendency for he signal to persist at too low a level, the control bits from the accumulator 92 will represent an increased gain. Thus, negative accumulated values select high gain while positive accumulated values select low gain. Of course this sign convention can easily be reversed if desired, or changed to any convention by inserting a look-up table between accumulator 92 and the AGC amplifier 60 to adapt the accumulator bit format to the format expected for controlling the AGC amplifier. For example, the look-up table could linearize the AGC amplifier gain control characteristic in decibels.

The scaling by $\frac{1}{2}^m$ determines the speed with which the AGC reacts to changes in signal level. In anticipation of the optimum reaction speed being different in different receiver operation modes, provision is made to alter "m" by setting it to a value from the processor 106/107. Likewise, in anticipation that the accumulator value should be saved upon changing from one receiver mode to another, replacing it by recalling a previously saved value for the new mode, provision is made to set the accumulator value, which also determines the receiver gain, from the processor. The measured mean signal level input to comparator 88 can be downsampled prior to being input to the AGC to accommodate different sampling rates in the low-pass filter and AGC.

Thus in the combination of FIGS. 6 and 7, four AGC-related parameters have been identified that may advantageously be saved in association with changing receiver operation from a first mode to a second mode and recalled and reset upon changing back to the first mode. The parameters are:

1. "n" related to signal-strength measurement smoothing filter time constant;
2. Accumulator value (V) for the smoothing filter;

3. "m" related to the AGC control loop speed; and
4. Accumulator value (G) related to the current gain setting These four parameters arise using a first order smoothing filter and a first order control loop. Higher order filters and control loops can of course be used. For example, a second order Infinite Impulse Response (IIR) smoothing filter may be used, defined by two coefficients and having two internal memory states to be saved. Likewise a second order control loop can be used, having two accumulator-integrators in cascade and a damping term to assure stability, as is well known from the theory of phase lock loops. A second order control loop isalso characterized by two coefficients that determine the loop natural frequency and the damping factor, and has two internal memory states (accumulator values) that may advantageously be saved. However, second order control loops can be unstable when the loop contains a saturating element, and the low-resolution AtoD convertors represent such an element.

Figure 8:
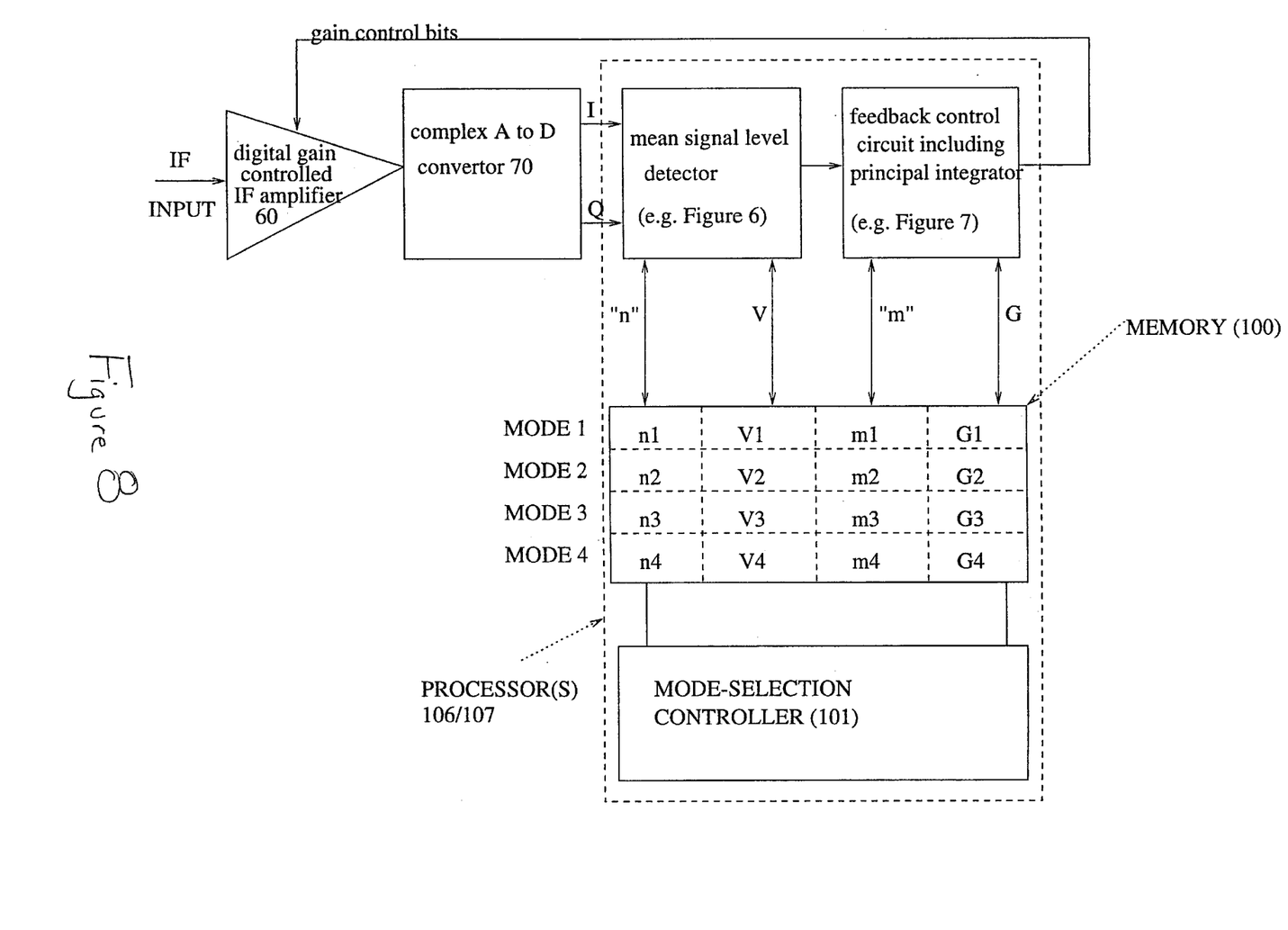
FIG. 8 illustrates a mode switching automatic gain control system according to the present invention.

FIG. 8 shows a combination of the above-described elements to form a mode-adaptive AGC system according to the present invention. The description of the operation of the feedback control loop is as given for FIG. 3; however, the parameters labeled "n", V, "m" and "G" which characterize the loop's performance and current state are shown coupled to a memory 100, which is also coupled to a mode-selection controller 101. The memory 100, mode selection controller 101, smoothing filter (FIG. 6) and loop integrator (FIG. 7) may all be part of signal processor 106 or of control processor 107 of FIG. 2, which therefore also control other blocks such as frequency synthesizer 105.

A receiver embodying the circuit of FIG. 8 according to an exemplary embodiment of the present invention may operate in a variety of modes illustratively labeled MODE 1, MODE 2, MODE 3 and MODE 4 in FIG. 8, each associated with a stored set of the AGC coefficients and state parameters. The two exemplary modes described in the macrocell/microcell situation of FIG. 1 are, respectively, decoding an information signal from one cell, and momentarily switching frequency to that of another cell to measure total signal strength from the other cell. Other modes can be envisaged however, such as sleep mode, in which the mobile phone in idle mode is powered down to save the battery and awakes periodically, for example, 20 mS every second, in a designated paging slot to determine if a call-alerting message addressed to it is being transmitted by the network. When awaking from sleep mode, there can be the need to use different AGC parameters, e.g., more rapidly to readjust the receiver gain to the signal level, which can have changed significantly in one second, as compared to traffic mode, where AGC is operative almost continuously. Yet another possible mode which can be handled in accordance with the present invention, is initial acquisition after power-on, in which the mobile phone searches a list of radio frequencies for a signal, preferably in order of a learned likelihood, and processes the strongest signals found to attempt to synchronize to and decode a broadcast control signal emitted by a network station. Initial acquisition requires receiver mode agility, and such operations are described in U.S. Pat. application Ser. No. 09/236,083 (Dent, filed Jan. 25, 1999) and entitled "Multi-Stage CDMA Synchronization with Parallel Execution", which application is hereby incorporated by reference herein.

It is not the purpose of this invention to determine what AGC parameters would be optimum for each mode, but rather to anticipate that they will be different and to provide a mechanism to store and retrieve them separately for each mode. The storage is provided by memory 100 under control of controller 101 and retrieval is effected by controller 101 in synchronism with selecting a different mode or frequency channel.

When changing modes, e.g., awakening from sleep mode, or when momentarily interrupting traffic mode intermittently to scan another frequency channel, the appropriate set of previously stored parameters for the new mode are recalled from memory 100. While the coefficients may not be dynamically changing parameters, the filter and controller state parameters (e.g. V and G) can become outdated due to not being allowed continuously to measure the signal being sampled. The need can therefore arise to predict the gain value G to use on a future occasion from past measurements or past gain values, and maybe also the need to reset V to a default value for starting smoothing of a new signal. Prediction generally involves determining a rate of change from past history and extrapolating, which requires a knowledge of the elapsed time. Success in extrapolating also depends on the length of time involved. If the elapsed time is too great, stored parameters, even if extrapolated, may not be accurate predictions. In these circumstances it is desirable to detect when prediction is doubtful and to revert to a default mode of operation, for example to set a default gain, or to institute an expanding search for a correct gain value by making first large gain steps, noting whether the measured signal strength is zero or has saturated the detector, and if so then successively reducing the gain step size until the signal strength falls within the range of the signal strength detector and the loop can be closed. The need for a timer is therefore evident to determine elapsed time since a set of stored parameters were last updated. The timer would for example be read by controller 101 at the time a set of parameters were saved upon exiting a mode. Upon next resuming a mode, the current timer value would be compared with the stored value to determine the elapsed time, which would be compared to a threshold. If the elapsed time was greater than a threshold, a default method for determining initial AGC parameters would be invoked, else if the elapsed time was less than the threshold, AGC parameters would be predicted based on the stored parameters and the elapsed time.

Various methods of predicting a parameter or parameters from previous values are known in the art variously as Linear Prediction, Auto-Regression, or Kalman filtering. A Kalman filter can for example be designed simultaneously to estimate the future signal strength and the rate of change of signal strength of a signal. The signal strength and its derivative can also be replaced by the gain G and its derivative, as the gain previously used is closely related to the signal strength. Such a 2-variable Kalman filter comprises a 2×2 matrix usually denoted by P, which is initialized with large diagonal terms and then successively updated after each measurement. The P-matrix element magnitudes determine how much each new measurement is allowed to affect the estimates of the variables and reduces after each measurement to reflect improving estimates. The P-matrix is prevented from going to zero, which, if allowed, would just result in providing mean values of the variables instead of tracking varying values. To allow tracking of varying values, the P-matrix is "bumped up" after each measurement by adding a constant matrix usually denoted by Q. The Q-matrix reflects how rapidly the filter is allowed to track varying values. Clearly, memory 100 can also be expanded to store a Kalman P-matrix, a Q matrix, a timer value and a gain derivative as well as the gain value, as well as other indicators such as a mode indicator and a frequency channel number, so that the invention is equipped for performing linear prediction of gain or signal strength values to improve gain adaptation for intermittently received signals. Such computations can also be performed by suitable software programs stored in signal processor 106 or control processor 107.

A person skilled in the art could construct a mode-adaptive AGC system using many variations on the theme given in the above teachings, without necessarily departing from the spirit and scope of the invention as described by the following claims.

What is claimed is:

1. A receiver, comprising:
    an amplifier for amplifying a received signal, the amplifier having gain control by an automatic gain control (AGC) system and producing an amplified signal;
    a state memory for storing a plurality of states, each state comprising a set of parameters stored in mutual association, the parameters including at least a receiver operating mode, a channel frequency, an AGC gain setting value, and an AGC time constant;
    an analog-to-digital converter for converting said amplified signal into a stream of digital values; and
    a processor configured to:
        receive said stream of digital values; and
        selectively retrieve a state from said state memory, thereby controlling a gain of said gain controlled amplifier using a first of said sets of parameters associated with a first receiver operating mode or alternatively using a second of said sets of parameters associated with a second receiver operating mode or at least a third of said sets of parameters associated with a third receiver operating mode.

2. The receiver of claim 1, wherein said first mode is a traffic mode for receiving said signal on a traffic frequency channel assigned to said receiver, said second mode is a measurement mode for measuring signals on other frequency channels, and said third mode is a sleep mode in which said receiver is at least partly powered down to conserve power.

3. The receiver of claim 1, wherein said first mode is a sleep mode wherein said receiver is operating at a first power level said second mode is an operative mode wherein said receiver is operating at a second power level greater than said first power level.

4. The receiver of claim 1, wherein said processor determines a mean signal level output by said analog-to-digital converter using a low-pass filter.

5. The receiver of claim 4, wherein said low-pass filter is a first order filter and wherein said first set of parameter values includes a first filter time constant value and said a second set of parameter values includes a second filter time constant value different than said first filter time constant value.

6. The receiver of claim 5, wherein said first mode is a traffic mode for receiving said signal on a traffic channel assigned to said receiver and said second mode is a measurement mode for measuring signals on other channels, and wherein said first filter time constant value provides for a smaller filter bandwidth than said second filter time constant value.

7. The receiver of claim 4, wherein said low pass filter is a second or higher order filter.

8. The receiver of claim 4, wherein said processor further comprises:
    a control loop for comparing said mean signal level with a target means signal level and controlling said gain based on said comparison, said control loop including at least one variable parameter which is set using a value selected from said first and second set of parameter values depending upon whether said receiver is operating in said first or second mode of operation, respectively.

9. The receiver of claim 8, wherein said at least one variable parameter is a scaling factor which determines a speed at which automatic gain control is performed.

10. The receiver of claim 8, wherein said control loop includes as said at least one variable parameter a value of a settable accumulator.

11. The receiver of claim 1, further comprising a memory device for storing said first and second sets of parameter values.

12. The receiver of claim 11, wherein each of said first and second sets of parameter values include: a first value associated with a filter time constant, a second value associated with a filter's accumulator value, a third value associated with a scaling factor, and a fourth value associated with an integrator's accumulator value.

13. The receiver of claim 11, wherein said processor is also operable to adjust said gain based on at least one additional mode of operation and wherein said memory device includes a set of parameter values for each said at least one additional mode of operation.

14. The receiver of claim 1, further comprising:
    a timer for determining an elapsed time since one of said first and second sets of parameter values were used by said processor; wherein said processor uses a default set of parameter values if said elapsed time is greater than a threshold and wherein said processor predicts a set of parameter values based on a stored set of parameter values and said elapsed time if said elapsed time is less than said threshold.

15. The receiver of claim 1, wherein said first mode is an idle mode from which the receiver has awoken to receive a control channel signal on a first channel and said second mode is an idle mode from which the receiver has awoken to measure the signal strength on a second channel.

16. A receiver, comprising:
    a gain controlled amplifier having a feedback control loop for amplifying a received signal;
    a mode selector for selecting one of a plurality of modes;
    an analog-to-digital converter for converting said amplified signal into a stream of digital values; and
    a processor configured to:
        receive said stream of digital values; and
        selectively control a gain of said gain controlled amplifier using a first set of parameter values when said receiver is operating in a first of said plurality of modes, a second set of parameter values when said receiver is operating in a second of said plurality of modes, and at least a third set of parameter values when said receiver is operating in a third of said plurality of modes;
    wherein said processor determines a mean signal level output by said analog-to-digital converter using a low-pass filter, said low-pass filter is a first order filter, said first set of parameter values includes a first filter time constant value and said second set of parameter values includes a second filter time constant value different from said first filter time constant value, and said first order filter includes a settable accumulator, which accumulator can be set by said processor using a value selected from said first, second and third set of parameter values depending upon whether said receiver is operating in said first, second, or third mode of operation, respectively.

17. A method for controlling a digital automatic gain control (AGC) circuit in a receiver, the method comprising the steps of:

operating said receiver in a first mode to receive signals on a traffic frequency channel assigned thereto;

switching to a second mode;

operating said receiver in said second mode to measure signal strengths associated with frequency channels other than said traffic frequency channel;

controlling a gain associated with an amplifier in said receiver by using a set of parameter values associated with said second mode of operation to process received signals after said receiver is switched to operate in said second mode, which set of parameter values is different for said first mode than said second mode; and switching to a third mode of operation of said receiver.

18. The method of claim 17, wherein said step of switching further comprises the steps of:

operating said receiver in a sleep mode to periodically awaken and receive signals in an assigned paging channel time slot;

switching from said sleep mode to an active mode wherein said receiver uses more power; and operating said receiver in said active mode to receive traffic signals.

19. The method of claim 17, further comprising the steps of:

A/D converting an output of said amplifier to generate a digital signal; and determining a mean signal level of said digital signal using a low-pass filter.

20. The method of claim 19, wherein said low-pass filter is a first order filter and wherein said set of parameter values for said first mode includes a first filter time constant value and said of parameter values for said second mode includes a second filter time constant value different than said first filter time constant value.

21. The method of claim 20, wherein said first mode is a traffic mode for receiving said signal on a traffic channel assigned to said receiver and said second mode is a measurement mode for measuring signals on other channels, and wherein said first filter time constant value provides for a smaller filter bandwidth than said second filter time constant value.

22. The method of claim 20, wherein said first order filter includes a settable accumulator, which accumulator can be set by said processor using a value selected from said first and second set of parameter values depending upon whether said receiver is operating in said first or second mode of operation, respectively.

23. The method of claim 19, wherein said low pass filter is a second or higher order filter.

24. The method of claim 19, further comprising the steps of:

comparing said mean signal level with a target means signal level; and controlling said gain based on said comparison, said control loop including at least one variable parameter which is set using a value selected from a first and second set of parameter values depending upon whether said receiver is operating in said first or second mode of operation, respectively.

25. The method of claim 24, wherein said at least one variable parameter is a scaling factor which determines a speed at which automatic gain control is performed.

26. The method of claim 24, wherein said at least one variable parameter a value of a settable accumnulator.

27. The method of claim 17, further comprising the step of:

storing said first said second, and a third sets of parameter values associated with said first, second, and third modes, respectively, wherein the parameter values include a receiver operating mode, a channel frequency, a gain control setting value, and a gain control time constant.

28. The method or claim 27, wherein each of said first and second sets of parameter values include: a first value associated with a filter time constant, a second value associated with a filter's accumulator value, a third value associated with a scaling factor, and a fourth value associated with an integrator's accumulator value.

29. The method of claim 17, further comprising the step of:

determining an elapsed time since one of said first and second sets of parameter values were used by said processor; wherein said processor uses a default set of parameter values if said elapsed time is greater than a threshold and wherein said processor predicts a set of parameter values based on a stored set of parameter values and said elapsed time if said elapsed time is less than said threshold.

* * * * *